US012609510B2

(12) United States Patent
Voigt et al.

(10) Patent No.: US 12,609,510 B2
(45) Date of Patent: Apr. 21, 2026

(54) INTEGRATED OPTOELECTRONIC DEVICE WITH OPTICAL INTERCONNECT STRUCTURE FOR IMPROVED BEOL DEVICE INTEGRATION

(71) Applicant: IHP GmbH-Innovations for High Performance Microelectronics/Leibniz-Instit. für innovative Mikroelektronik, Frankfurt (DE)

(72) Inventors: Karsten Voigt, Frankfurt (DE); Lars Zimmermann, Frankfurt (DE); Christian Mai, Frankfurt (DE); Jochen Kreissl, Frankfurt (DE)

(73) Assignee: IHP GMBH—INNOVATIONS FOR HIGH PERFORMANCE MICROELECTRONICS / LEIBNIZ-INSTITUT FÜR INNOVATIVE MIKROELEKTRONIK, Frankfurt (DE)

( * ) Notice: Subject to any disclaimer, the term of this patent is extended or adjusted under 35 U.S.C. 154(b) by 217 days.

(21) Appl. No.: 18/567,471

(22) PCT Filed: Jun. 8, 2022

(86) PCT No.: PCT/EP2022/065482
§ 371 (c)(1),
(2) Date: Dec. 6, 2023

(87) PCT Pub. No.: WO2022/258655
PCT Pub. Date: Dec. 15, 2022

(65) Prior Publication Data
US 2024/0266801 A1 Aug. 8, 2024

(30) Foreign Application Priority Data
Jun. 8, 2021 (EP) .................................... 21178302

(51) Int. Cl.
*H01S 5/10* (2021.01)
*G02B 6/12* (2006.01)
(Continued)

(52) U.S. Cl.
CPC ........ *H01S 5/1028* (2013.01); *G02B 6/12002* (2013.01); *G02B 6/1228* (2013.01);
(Continued)

(58) Field of Classification Search
CPC ............ G02B 6/12002; G02B 6/12038; G02B 6/1228; G02B 6/13; H01S 5/1028; H01S 5/3013
See application file for complete search history.

(56) References Cited

U.S. PATENT DOCUMENTS 9,509,122 B1    11/2016  Norberg et al.
9,941,664 B1     4/2018  Hahn et al.
(Continued)

FOREIGN PATENT DOCUMENTS

CN        111247704 A   *  6/2020  ........... H01S 5/1032
WO    WO 2022/258655        12/2022

OTHER PUBLICATIONS

Applicant's remarks accompanying EP 21178302 patent application on Jun. 9, 2023 (Year: 2023).*
(Continued)

*Primary Examiner* — Charlie Y Peng
(74) *Attorney, Agent, or Firm* — Sheridan Ross P.C.

(57) ABSTRACT
An integrated optoelectronic device comprises a substrate with a silicon layer comprising one or more electronic components. An interconnect stack comprising a plurality of metal levels is arranged on the substrate. A front-end-of-line (FEOL) optical waveguide on the substrate has an optical FEOL coupling section. A photonic component is arranged in the interconnect stack at a distance from the substrate. A
(Continued)

back-end-of-line (BEOL) optical waveguide in the interconnect stack is optically coupled to the photonic component and has an optical BEOL coupling section. An optical interconnect structure is configured for optically coupling radiation from the BEOL coupling section into the FEOL coupling section and vice versa. The optical interconnect structure comprises a stack of wave-guide elements made of a first dielectric material, which each are embedded in a second dielectric material and which in a desired wavelength range have an index of refraction higher than the second dielectric material.

14 Claims, 8 Drawing Sheets

(51) Int. Cl.

| | | |
|---|---|---|
| *G02B 6/122* | (2006.01) | |
| *G02B 6/13* | (2006.01) | |
| *G02B 6/28* | (2006.01) | |
| *H01S 5/02* | (2006.01) | |
| *H01S 5/125* | (2006.01) | |
| *H01S 5/30* | (2006.01) | |

(52) U.S. Cl.
CPC ............. *G02B 6/13* (2013.01); *G02B 6/2821* (2013.01); *H01S 5/021* (2013.01); *H01S 5/1014* (2013.01); *H01S 5/125* (2013.01); *H01S 5/3013* (2013.01)

(56) References Cited

U.S. PATENT DOCUMENTS

| | | | |
|---|---|---|---|
| 9,960,297 B2 | 5/2018 | Norberg et al. | |
| 10,256,603 B2 | 4/2019 | Caër et al. | |
| 10,554,018 B2 | 2/2020 | Ferreira Villares et al. | |
| 2014/0153600 A1* | 6/2014 | Luo ........................ | B82Y 20/00 |
| | | | 372/40 |
| 2014/0321802 A1 | 10/2014 | Ellis-Monaghan et al. | |
| 2015/0247974 A1 | 9/2015 | Painchaud et al. | |
| 2016/0356958 A1 | 12/2016 | Shi et al. | |
| 2017/0139132 A1 | 5/2017 | Patel et al. | |
| 2018/0239088 A1 | 8/2018 | Guerber et al. | |
| 2018/0240820 A1 | 8/2018 | Hahn et al. | |
| 2018/0241176 A1 | 8/2018 | Abel et al. | |
| 2019/0018161 A1 | 1/2019 | Wang et al. | |
| 2020/0136341 A1 | 4/2020 | Kang et al. | |
| 2022/0221650 A1* | 7/2022 | Bian ........................ | G02B 6/34 |
| 2024/0219651 A1* | 7/2024 | Lischke ............... | G02B 6/4201 |

OTHER PUBLICATIONS

Zhu et al., "Vertically Stacked Multilayer Photonics on Bulk Silicon Toward Three-dimensional Integration," Journal of Lightwave Technology, vol. 34, No. 2, Jan. 15, 2016, pp. 386--392.

International Search Report and Written Opinion for International (PCT) Patent Application No. PCT/EP2022/065482, dated Oct. 6, 2022, 11 pages.

Extended European Search Report for Europe Patent Application No. 21178302.2, dated Dec. 15, 2021, 9 pages.

* cited by examiner

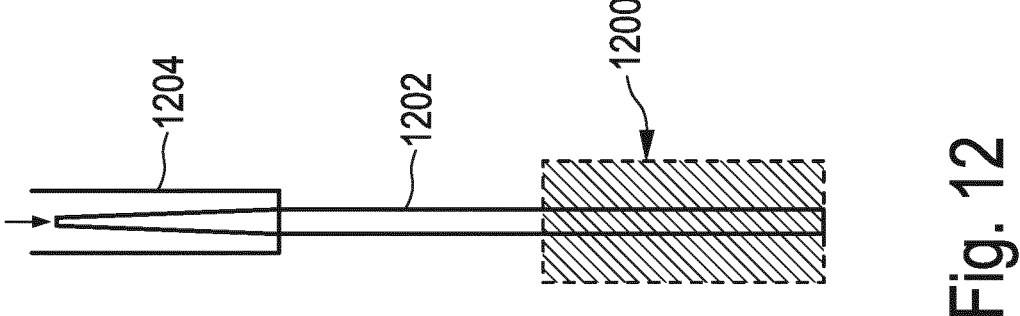
Fig. 12
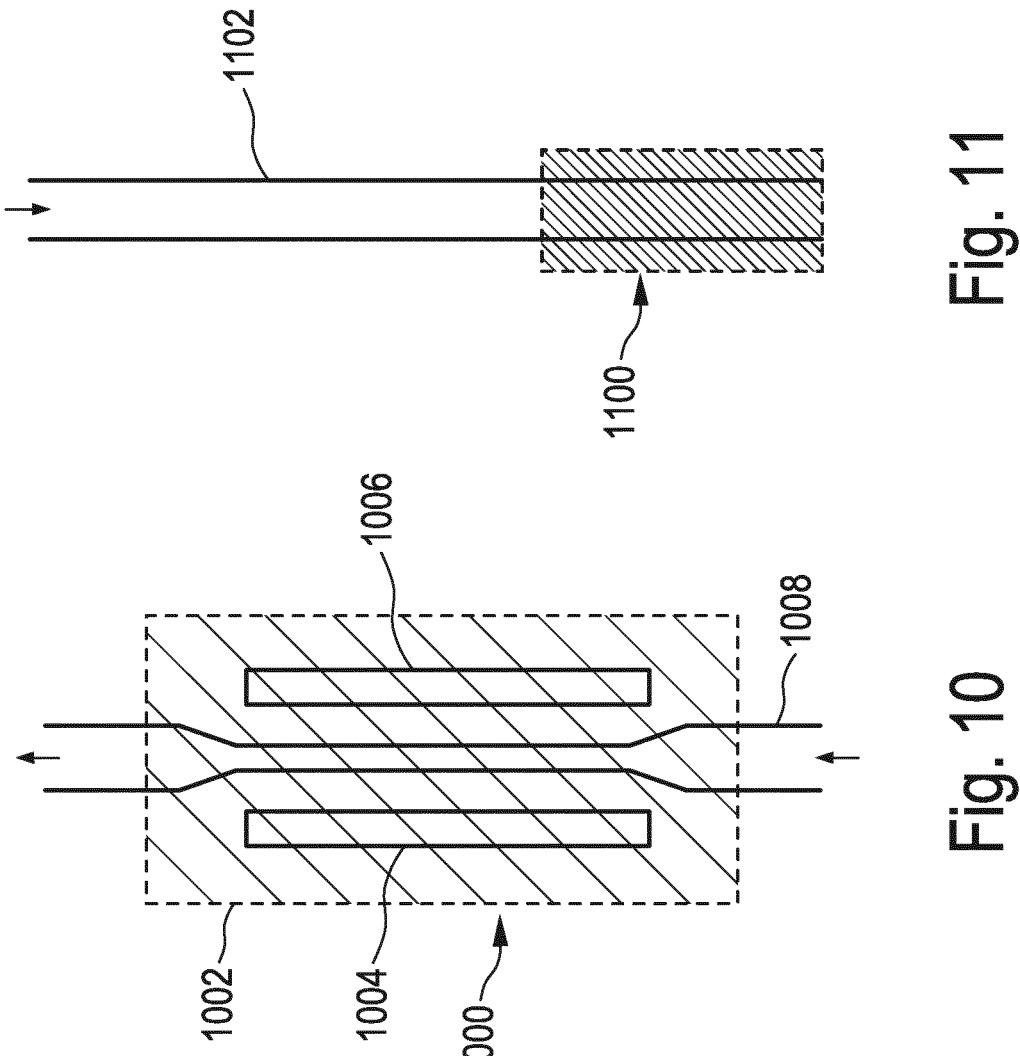
Fig. 11
Fig. 10

1

INTEGRATED OPTOELECTRONIC DEVICE WITH OPTICAL INTERCONNECT STRUCTURE FOR IMPROVED BEOL DEVICE INTEGRATION

CROSS REFERENCE TO RELATED APPLICATIONS

This application is a national stage application under 35 U.S.C. 371 and claims the benefit of PCT Application No. PCT/EP2022/065482 having an international filing date of 8 Jun. 2022, which designated the United States, and which PCT application claimed the benefit of European Patent Application No. 21178302.2 filed 8 Jun. 2021, the contents of each of which are incorporated herein by reference in their entireties.

The present invention is in the field of photonics and related to an integrated optoelectronic device and to a method for fabricating an optoelectronic device.

Optical radiation wavelengths of 1.3 and 1.55 μm are typically used for transmission of light signals in fiber-optic telecommunication systems. The infrared wavelength of 1.55 μm is particularly suited for silicon-based photonics and optoelectronic devices, which use silicon as an optical medium. However, silicon based opto-electronics is also suited for other applications in other spectral ranges from the visible to the mid infrared, in particular between 0.4 to 1.8 μm.

Zhu et al., in JOURNAL OF LIGHTWAVE TECHNOLOGY, VOL. 34, NO. 2, Jan. 15, 2016, pp. 386-392 describe vertically stacked hydrogenated amorphous silicon (a-Si:H) and aluminum nitride (AlN) photonic circuits fabricated on bulk silicon using a complementary metaloxide semiconductor (MOS) back-end-of-line (BEOL) compatible technology. To link a-Si:H waveguide and an AlN waveguide with a 2-μm vertical gap, the use of two cascaded directional 0.4 μm thick AlN couplers is proposed. For bridging larger vertical gaps, an interlayer grating coupler is proposed for ease in fabrication and small footprint.

U.S. Pat. No. 9,941,664B1 describes a laser device that includes a layer structure with a stack of III-V semiconductor gain materials, a silicon waveguide core and a cladding structure. The cladding structure extends between the waveguide core and the stack. The device further comprises an optical coupling structure formed in the layer structure. This coupling structure is designed to allow an optical coupling of radiation between the stack of III-V semiconductor gain materials and the waveguide core, and to favor a coupling of a fundamental transverse optical mode of the radiation over a coupling of one or more higher-order transverse optical modes of said radiation from the stack into the waveguide core.

US 2018/0240820 describes another optoelectronic device. It comprises a layer structure with a silicon-on-insulator (SOI) substrate that includes a silicon substrate, a buried oxide layer over the silicon substrate and a tapered silicon waveguide core over the buried oxide layer. The silicon waveguide core is cladded by a first cladding structure, which is followed by a bonding layer over the first cladding structure. A stack of III-V semiconductor gain materials is arranged on the bonding layer. The stack of III-V semiconductor gain materials is cladded by a second cladding structure. The layer structure is configured to optically couple radiation between the stack of III-V semiconductor gain materials and the tapered silicon waveguide core.

An advantage of such devices is the possibility of using III-V semiconductor materials for active photonic components in monolithical silicon-based CMOS devices. This is achieved by performing the fabrication of the III-V semiconductor materials as a part of the back-end-of line (BEOL) processing, thus avoiding process complications and incorporation of unwanted defects in the sensitive CMOS front-end-of-line (FEOL) processing.

As a downside of this concept, such known BEOL compatible integration approaches require device thicknesses limited to a few hundred nanometer. For comparison, typical thicknesses of optimized, commercially available optoelectronic devices are on the order of a few micrometer. The known thinner devices suffer from high series resistances, modal losses, and often require an increased epitaxial effort. These disadvantages exist irrespective of the particular material type that is used for the photonic component in the BEOL processing.

It would be desirable to avoid or reduce these disadvantages in integrated optoelectronic devices.

The present invention comprises two aspects, which are a device aspect and a method aspect, as expressed by independent claims 1 and 14, respectively. The following description will first turn to the first aspect.

According to a first aspect of the present invention, an integrated optoelectronic device in accordance with claim 1 is disclosed.

Embodiments of the integrated optoelectronic device disclosed herein comprise a substrate with a silicon layer that comprises one or more electronic components;

an optical waveguide, hereinafter FEOL waveguide on the substrate, the FEOL waveguide having an optical FEOL coupling section;

an interconnect stack arranged on the substrate and comprising a plurality of metal levels, which contain structured metal connect traces and are separated from each other by an interlevel dielectric material, the metal levels being named by order numbers counting incrementally with increasing vertical distance from the substrate and starting with a first metal level that is the one closest to the silicon layer of the substrate, up to a top metal level at a highest vertical distance from the substrate;

a photonic component arranged in the interconnect stack at a vertical distance from the substrate larger than that of the second metal level;

an optical waveguide in the interconnect stack, hereinafter BEOL waveguide, optically coupled to the photonic component and having an optical BEOL coupling section; and an optical coupling region that extends between the BEOL coupling section and the FEOL coupling section and comprises an optical interconnect structure arranged and configured for optically coupling radiation from the BEOL coupling section into the FEOL coupling section and vice versa; wherein the optical interconnect structure comprises a vertical stack of at least two optically coupled waveguide elements made of a first dielectric material, which each are embedded in a second dielectric material and which in a desired wavelength range have an index of refraction of a higher value than the embedding second dielectric material.

In particularly advantageous embodiments, the optically coupled waveguide elements are arranged and configured for receiving optical radiation in the desired wavelength range from the BEOL coupling section or the FEOL coupling section by coupling the optical radiation into at least one of the waveguide elements, cooperatively forming and sustaining, using the coupled optical radiation, one or more supermodes of optical radiation, each of the one or more supermodes being a superposition of modes of all of the at least two optically coupled waveguide elements, and for coupling optical radiation of the one or more supermodes into the FEOL coupling section or the BEOL coupling section, respectively.

The present invention provides an optoelectronic device that includes a photonic component and an optical interconnect structure that improves the integration of the photonic component in the BEOL processing by enabling highly efficient coupling to the FEOL waveguide. In particular embodiments, the vertical distance between the BEOL waveguide and the FEOL waveguide that can be bridged using the optical interconnect structure reaches 10 μm or even more. In comparison, the mentioned known BEOL-compatible integration approaches rely on direct coupling between the photonic component and the SOI waveguide and thus are bound to integrating the photonic component in a region of the interconnect stack that is immediately above the FEOL part of the optoelectronic device. In this region of the interconnect stack, the vertical spacing between the metal levels are limited by the industry standards of BEOL processing and are typically less than 1 μm. In contrast, the design of the optoelectronic device of the present invention offers the possibility of integrating photonic components with much larger thickness, such as III-V semiconductor lasers with a thickness of about 3 μm. The design options for photonic components are thus very much expanded in comparison with the known solutions.

The optical connection between photonic component is achieved by integration of an optical coupling region that extends between the BEOL coupling section and the FEOL coupling section and comprises an optical interconnect structure. The optical interconnect structure is arranged and configured for optically coupling radiation from the BEOL coupling section into the FEOL coupling section or, depending on the desired direction of light propagation, vice versa.

In advantageous embodiments, the optical interconnect structure comprises a vertical stack of at least two, preferably at least three, even more preferably at least four optically coupled waveguide elements made of a first dielectric material, which each are embedded in a second dielectric material. In a desired wavelength range, the waveguide elements have an index of refraction of a higher value than the second dielectric material, in which are embedded. Suitably, the optically coupled waveguide elements are arranged and configured for receiving optical radiation in the desired wavelength range from the BEOL coupling section (or, in case of reverse direction of light propagation: the FEOL coupling section) by coupling the optical radiation into at least one of the waveguide elements.

Furthermore, the optically coupled waveguide elements are arranged and configured for cooperatively forming and sustaining, using the optical radiation coupled, one or more supermodes of optical radiation. The mode field vertically extends across the vertical stack of coupled the at least two optically coupled waveguide elements. In particular, each of the one or more supermodes is a superposition of modes of all of the at least two optically coupled waveguide elements. Thus, all waveguide elements of the interconnect structure are involved in the formation of each of the one or more supermodes. The structure of the present invention is thus distinguished from an implementation designed for a pairwise coupling via thick AlN waveguides as disclosed by Zhu et al. by achieving a simultaneous distribution of light with vertical overlap across all waveguide elements. In comparison, Zhu et al. follow a step-by-step approach of light propagation along a cascade of AlN waveguides.

Supermodes are per se known. Supermodes can be described as a linear combination of the modes of the individual waveguide elements. A supermode can be achieved by providing the vertical stack of at least two waveguide elements with suitable geometrical extensions, and arranging them so as to allow an optical coupling of modes with non-vanishing mode contributions from all of the at least two waveguide elements, such that all of the at least two different waveguide elements act cooperatively in the formation of each supermode and thus promote the propagation of light across the vertical stack.

Furthermore, the optically coupled waveguide elements are arranged and configured for coupling optical radiation of the one or more supermodes into the FEOL coupling section or the BEOL coupling section, respectively.

The optical interconnect structure provides a connection between the BEOL coupling section and the FEOL coupling section that allows an efficient coupling of light, even over a large vertical distance, in some embodiments extending even into the range above 10 micrometer.

A further advantage of the optoelectronic device of the present invention is that it provides a wide range of design options for the inclusion of active or passive photonic components by providing for their integration in the BEOL processing. The following will briefly explain the technological background, on which this advantage is based. As is per se known in the field of semiconductor processing, the front-end-of-line (FEOL) is the portion of fabrication of integrated electronic and optoelectronic devices in which the individual electronic or optoelectronic components, e.g., transistors, diodes, resistors, capacitors, etc. of the device are patterned in the semiconductor substrate, which in the present field in particular is an substrate. As such, the FEOL portion of fabrication covers those processing steps, which are performed before the deposition of the interconnect stack. Thus, at the end of the FEOL processing, there is a wafer with components that are not connected by wiring. The back end of line (BEOL) is the subsequent portion of fabrication, in which an interconnect stack with interconnections between the individual components on the wafer is fabricated, including the desired wiring in the metal planes of the interconnect stack and vias connecting wiring on different metal planes. BEOL processing thus typically begins, after FEOL processing, with the deposition of first metal plane on the substrate. BEOL processing also includes the fabrication of contacts, dielectric layers, and bonding sites for chip-to-package connections. Since FEOL and BEOL processing are performed in different processing facilities, the strict requirements regarding avoidance of contamination of the processed wafer that apply in a FEOL processing facility, do not equally apply in BEOL processing, thus offering much larger freedom to include materials in the BEOL processing that would not be allowed for processing in a FEOL CMOS processing facility. This applies in particular to the use of III-V semiconductor materials because group-III metals like Ga, Al and In and group-V elements like N, P, and As are unwanted contaminants in silicon-based CMOS processing. Other materials used for active photonic components like frequency converters etc. include other species considered unwanted in a FEOL processing facility.

The following section is intended for guiding in the interpretation of terms used in the present specification.

The term waveguide element, as used herein, refers to a vertically and, in particular, laterally limited slab or cuboid made of the first dielectric material as a propagation medium and embedded into the second dielectric material. The waveguide element generally operates on the same principles as optical fibers, but, due to its limited lateral extensions, is not so much designed for lateral propagation of light as it is designed for contributing to the cooperative (with the other waveguide elements) forming and sustaining of a supermode achieving for a vertical propagation of light between the BEOL and FEOL coupling sections of the respective BEOL and FEOL waveguides. For clarity of distinction from an interlayer grating coupler structure, a waveguide element on a given vertical level of the interconnect stack is a single, laterally limited and contiguous material slab. It is noted in this context, that interlayer grating coupler structures are not suitable in practice for bridging larger vertical distance because of large optical losses.

The term photonic component is well known in the art and used herein as known. Photonic components include active and passive photonic components. Active photonic component as used herein cover a range of devices, which are electrically drivable, in particular to generate light, modify properties of light, such as the light intensity, light frequency, phase, or polarization, in particular by switching impose a modulation on the intensity, frequency, phase, or polarization properties of incoming light with a controllable time-behavior, or detect light, in particular light intensity or one of its other mentioned properties.

Examples of active photonic components that can be integrated monolithically into the interconnect stack are in particular light-emitting diodes, lasers, modulators, light detectors, tuneable optical delay elements, frequency converters and polarization converters. Such active photonic components often make use of particular materials, which are not considered compatible with current advanced CMOS processing schemes used in FEOL processing. Therefore, the integration of these components into the BEOL processing avoids processing limitations in monolithic integration of active photonic components with advanced CMOS technologies and thus greatly improves the application prospects of Si photonics. In contrast, passive photonic components are typically not electrically driven and have a particular desired response to incident light. Passive components are for instance filters, splitters, combiners, couplers, multiplexers, attenuators, isolators, and circulators.

It is further noted that the present specification does not make a difference between the terms optoelectronic and electro-optical. Devices in accordance with the present invention can thus also be considered and called electro-optical devices.

Furthermore, the term "integrated optoelectronic device" as used herein refers to a monolithic form of integration, suitably by combined FEOL and BEOL processing based on processing technologies known per se, but modified in accordance with the method of the present invention, which will be disclosed further below.

Finally, regarding the indication of directions in the present specification, the "vertical" direction is perpendicular to a surface plane of the substrate and points from the surface plane towards the interconnect stack, or opposite thereto. Lateral directions are parallel to that surface plane of the substrate.

In the following, further embodiments of the optoelectronic device of the present invention will be described.

As will become clear from the description of the embodiments below, the number of waveguide elements in the vertical stack can be varied depending on the application case, which involves in particular requirements on a vertical distance that is to be bridged by the optical interconnect structure. In some embodiments which are particularly suited for a smaller vertical distance, the number of waveguide elements in the interconnect stack that cooperate to form the one or more supermodes is at least two. In embodiments designed for bridging a larger vertical thickness, the number is at least three, preferably even at least four, in others at least five, and in some embodiments designed for particularly large vertical distances at least six. The upper limit of waveguide elements that can be used is determined by the recognition of the inventors that the vertical distance between the FEOL coupling section and the BEOL coupling section, which is typically determined by the number of metal levels used, should not exceed 15-20 micrometer.

The following group of embodiments has advantageous features in the optical interconnect structure. The minimal spatial extension of an eigenmode is a function of the spatial waveguide extension. Generally, the spatial extension of the eigenmodes of an individual waveguide element increases with decreasing vertical and lateral extension of the waveguide element. In particular, the spatial extension of an eigenmode increases as described provided the waveguide size is below the size associated with the minimal mode size. Thus, by adapting the extensions of the individual waveguide elements of the interconnect structure, a suitable design for a given application case can be achieved. In advantageous embodiments of the integrated optoelectronic device, the individual optical waveguide elements laterally overlap each other and have a respective vertical extension (thickness) of between 10 and 300 nanometer and are arranged at a vertical distance of between 0.5 and 2 micrometer from each other. This way, the extension of the modes of the individual waveguide elements in lateral and vertical directions and the coupling of the different modes between the different waveguide elements in the formation of the one or more supermode is particularly suitable for achieving an efficient coupling between the BEOL and FEOL coupling sections of the respective BEOL and FEOL waveguides.

For Si photonics in the 1.55 micrometer range, a suitable, but exemplary vertical extension of the waveguide elements is between 30 and 80 nanometer, in particular 50 nanometer. Exemplary suitable vertical distances between the waveguide elements range between 1.5 micrometer and 2 micrometer. In particular designs of the optical interconnect structure, depending on the requirements of a given application case, vertical distances between different pairs of vertically neighboring waveguide elements of the optical interconnect structure are different.

Similar design considerations apply to the coupling between the BEOL coupling section and the optical interconnect structure, as well as to the coupling between the optical interconnect structure and the FEOL coupling section. Preferably, the FEOL coupling section and the BEOL coupling section are at a respective vertical distance of between 0.1 and 2 micrometer from their respective nearest waveguide element of the interconnect structure and laterally overlap their respective nearest waveguide element. In particularly advantageous embodiments, a vertical distance between lowest (in terms of vertical distance from the substrate) waveguide element of the optical interconnect structure and the FEOL waveguide, which vertical distance is smaller than the vertical distance between highest waveguide element of the optical interconnect structure and BEOL waveguide.

There is a very large range of possible lateral extensions that the waveguide elements can assume. Tentatively, Suitably, the individual optical waveguide elements have a respective first lateral extension in a first lateral direction (z) between 10 and 1000 micrometer, in some embodiments between 50 and 150 micrometer, and a second lateral extension in a second lateral direction (x) that is perpendicular to the first lateral direction of between 1 and 20 micrometer, in some embodiments 2 micrometer and 10 micrometer.

In an application case in Si photonics in particular, an exemplary value of the first lateral extension between 80 and 120 micrometer has proven suitable, in one embodiment 100 micrometer. An exemplary suitable second lateral extension is between 3 and 7 micrometer, in some embodiments 5 micrometer.

As to the lateral overlap between the waveguide elements of the optical interconnect structures, a large lateral overlap is typically preferred for achieving a higher coupling efficiency. Thus, neighboring waveguide elements suitably exhibit full lateral overlap, unless other design requirements apply. Such other design requirements concern for instance the lateral extension of the modes contributing to the supermodes, and thus to the required propagation properties of the optical interconnect structure in one or more lateral directions. In particular, the uppermost and lowermost waveguide elements may have a larger first lateral extension (in z direction) reaching closer to the BEOL and FEOL coupling sections to improve coupling efficiency.

The following turns to different embodiments with different suitable materials of the waveguide elements. The embedding (i.e., second) dielectric material, which may also be referred to as a cladding material, is preferably silicon dioxide. This way, the process integration into standard BEOL processing is particularly easy. However, it is possible to use another cladding material, in particular if the expense of higher processing cost is justified by improved coupling efficiency or reduced material cost.

Given silicon dioxide as the choice for the cladding material, different material options exist of the first dielectric material of the waveguide elements. Suitable materials have an index of refraction in the desired wavelength range that higher than that of the cladding material. A suitable value range of the index of refraction is in this case 1.5 to 2.8. Examples of suitable materials include aluminum nitrides, aluminum oxides, aluminum oxinitrides, hafnium oxides, tantalum oxides, titanium oxides, silicon nitrides, silicon oxinitrides, or a zirconium oxides. The stoichiometry of these compound materials may be adapted for an optimization of the dielectric properties in a given application case. A material allowing a particularly easy integration into the BEOL processing is SiN because this material is very well known in BEOL processing from other device applications.

Further, for ease of processing, the material of the interlevel dielectric layers, of the top interlevel dielectric layer and of the second dielectric material in the optical coupling region is preferably identical.

The following turns to embodiments with additional features used in the interconnect stack. A minimum thickness of the interconnect stack is 1.5 micrometer. However, the present invention largely expands the number of metal levels that can be used. Thus, the vertical distance between the FEOL coupling section and the BEOL coupling section, which is typically determined by the number of metal levels used, may preferably reach, but should not exceed 15-20 micrometer, and even more preferably should not exceed 12 micrometer.

Embodiments of the optoelectronic device of the present invention achieve particular advantages over the prior art, where the interconnect stack comprises at least two metal levels. In some embodiments, top metal levels are provided in addition to the metal levels. Suitably, the plurality of metal levels in the interconnect stack includes at least three metal levels, a first top metal level and a second top metal level above the at least three metal levels, the second top metal level being the top metal level at the highest vertical distance from the substrate. A particularly useful property resulting from a processing compatibility with standard BEOL designs is that a top interlevel dielectric layer between the two top metal levels typically has a larger vertical extension than the interlevel dielectric layers between the metal levels. In other words, in such embodiments type, a mutual vertical distance between the first and second top metal levels is larger than a mutual vertical distance between the metal levels below the first top metal level. The photonic component and the BEOL waveguide are thus arranged at a vertical level between the first and second top metal levels. This allows an easy integration of photonic components with a larger vertical extension between the two top metal levels. In alternative embodiments, the photonic component and the BEOL waveguide are arranged on the topmost metal level. Depending on the particular structure of the interconnect stack, this may be the only top metal level, or the highest of two or more top metal levels. Where required, these embodiments may suitably make use of additional wiring outside the interconnect stack or of metal interconnects on metal layers of the interconnect stack that are different from the topmost metal level to electrically connect the photonic component.

To further improve the coupling efficiency, the BEOL coupling section of the BEOL optical waveguide and the FEOL coupling section of the FEOL optical waveguide have a taper in some embodiments of the optoelectronic device.

The following description turns to embodiments with particular features of the photonic component. Embodiments of optoelectronic device of the present invention typically include more than one active photonic component or passive photonic component or a combination of at least one active and at least one passive photonic component in the interconnect stack. In preferred embodiments of the optoelectronic device, the active photonic component is an electrically drivable component and is electrically connectable via the top metal level. An optical output of the photonic component is optically coupled to the BEOL optical waveguide via a second BEOL coupling section of the BEOL optical waveguide. The integrated optoelectronic device may thus comprise one or more active and/or passive photonic components, including in particular a laser, a light detector, an optical modulator for modulating intensity, phase or polarization of light, an optical switch, an optical delay element, an optical amplifier, or an optical frequency converter. Passive components are in particular filters, splitters, combiners and isolators.

As mentioned, some embodiments of the optoelectronic device have an active photonic component with an active region that comprises or is completely made of III-V semiconductor material. A particularly useful example of an electrically drivable active photonic component is a semiconductor laser, which comprises a laser resonator that includes an electrically drivable gain region made of the III-V-semiconductor material for providing optical gain.

One variant of this embodiment additionally includes a BEOL input waveguide and a BEOL output waveguide that is formed by the BEOL waveguide for providing the laser radiation to the FEOL waveguide via the optical interconnect structure. Furthermore, respective input and output Bragg gratings forming respective end reflectors of the laser resonator for a desired wavelength spectrum of laser radiation are arranged in the BEOL input and output waveguide. Another variant of this embodiment makes use of a distributed-feedback (DFB) laser with an electrically drivable gain region that contains a periodically structured scattering element or a diffraction grating, each of which build an interference grating for providing the required optical feedback. In a DFB laser, thus, the grating and the reflection are generally continuous along the laser cavity, instead of being arranged at the longitudinal ends.

Another particular useful example of an electrically drivable active photonic component is an optical amplifier, which comprises an electrically drivable gain region made of a III-V-semiconductor material for providing optical gain. Such an optical amplifier does not include a resonator.

Another useful example is an electrically controlled III-V semiconductor material, or an electro-optic material such as lithium niobate (LNB), barium titanate (BTO) or lead zirconate titanate (PZT), or an electro-optic polymer for change of optical phase and/or intensity to implement optical switching or modulation. A subset of such devices are plasmonic phase shifters, modulators and switches.

Another useful example is an electrically readout III-V semiconductor material for absorption of light and therefore optical-electrical conversion (detection). A subset of such devices are plasmonic detectors.

The present invention is particularly suited for applications in silicon photonics. Different embodiments of the optoelectronic device make use of different substrates, depending on what particular material platform within the framework of silicon photonics is used. The particular material platform selected for the integrated optoelectronic device in turn is influenced by the desired wavelength range of operation.

In many application cases, the most suitable substrate is a silicon-on-insulator substrate, herein SOI substrate. Silicon on Insulator is a semiconductor technology where components are fabricated in a silicon layer on top of a buried insulator layer. SOI substrates are suitable in particular for applications in the near and mid infrared regions between 1.2 μm and 3 μm wavelength, which include the wavelengths used for data communication via glass fiber. In these embodiments of the optoelectronic device, the silicon layer comprising the one or more electronic components is arranged above a buried oxide layer of the SOI substrate. Moreover, in such application cases, the FEOL waveguide having the optical FEOL coupling section is suitably also formed in this top silicon layer of the SOI substrate. An advantage of SOI technology is its compatibility with well-established CMOS fabrication processes and the associated infrastructure used in microelectronics and thus provides advantages in terms of compatibility, reproducibility and cost.

However, an SOI substrate is not required for instance, if a silicon nitride material platform is used. This technology is based on a combination of silicon nitride (e.g. $Si_3N_4$) as waveguide layers, filled by or encapsulated with silica ($SiO_2$) as cladding layers on a silicon wafer. Silica and silicon nitride layers can be fabricated using CMOS-compatible techniques and thus share the advantage of a cost-effective volume production. This technology is suitable for applications in the range of the visible wavelengths of 0.4 μm to the upper part of the near infrared of wavelengths around 4 μm. Silicon nitride photonics is particularly suitable for applications in biophotonics, data communication, optical signal processing and sensing, from visible, through near to mid-infrared wavelengths.

Instead of a SOI substrate, a III-V semiconductor substrate may be used in application cases with operating wavelengths in the near infrared range, up to the upper part of the near infrared of wavelengths around 4 μm.

A second aspect of the present invention is concerned with the fabrication of an optoelectronic device. According to the second aspect, a method for fabricating an optoelectronic device in provided in accordance with claim 14. In particular, embodiments of the method achieve a fabrication of embodiments of the optoelectronic device of the first aspect according to one of its embodiments described herein.

The method for fabricating an optoelectronic device comprises, in accordance with the second aspect of the present invention, performing front-end-of line, hereinafter FEOL, processing to provide a substrate with a silicon layer that comprises one or more electronic components and with a FEOL optical waveguide formed in the silicon layer, wherein a FEOL coupling section is fabricated in the FEOL optical waveguide;

performing back-end-of-line, hereinafter BEOL, processing to fabricate an interconnect stack on the substrate, the BEOL processing comprising fabricating a plurality of metal levels of the interconnect stack, which contain structured metal connect traces and are separated from each other by an interlevel dielectric material, the metal levels being named by order numbers counting incrementally with increasing vertical distance from the substrate and starting with a first metal level that is the one closest to the silicon layer of the substrate, up to a top metal level at a highest vertical distance from the substrate; and fabricating a photonic component arranged in the interconnect stack at a vertical distance from the substrate larger than that of the second metal level; and fabricating an optical coupling region that extends between the BEOL coupling section and the FEOL coupling section and comprises an optical interconnect structure arranged and configured for optically coupling radiation from the BEOL coupling section into the FEOL coupling section and vice versa;

wherein fabricating the optical interconnect structure comprises fabricating a vertical stack of at least two optically coupled waveguide elements made of a first dielectric material, which each are embedded in a second dielectric material and which in a desired wavelength range have an index of refraction of a higher value than the embedding second dielectric material.

Embodiments of the method comprise arranging and configuring the optically coupled waveguide elements for receiving optical radiation in the desired wavelength range from the BEOL coupling section or the FEOL coupling section by coupling the optical radiation into at least one of the waveguide elements, cooperatively forming and sustaining, using the coupled optical radiation, one or more supermodes of optical radiation, each of the one or more supermodes being a superposition of modes of all of the at least two optically coupled waveguide elements, and for coupling the one or more supermodes into the FEOL coupling section or the BEOL coupling section, respectively.

In the following, further embodiments will be described with additional reference to the drawings. In the drawings:

FIGS. 7 to 12 are schematic top views of different embodiments of optoelectronic devices having different photonic components.

FIG. 1 is a schematic cross-sectional view of an integrated optoelectronic device 100 according to an embodiment of the present invention.

Figure 1:
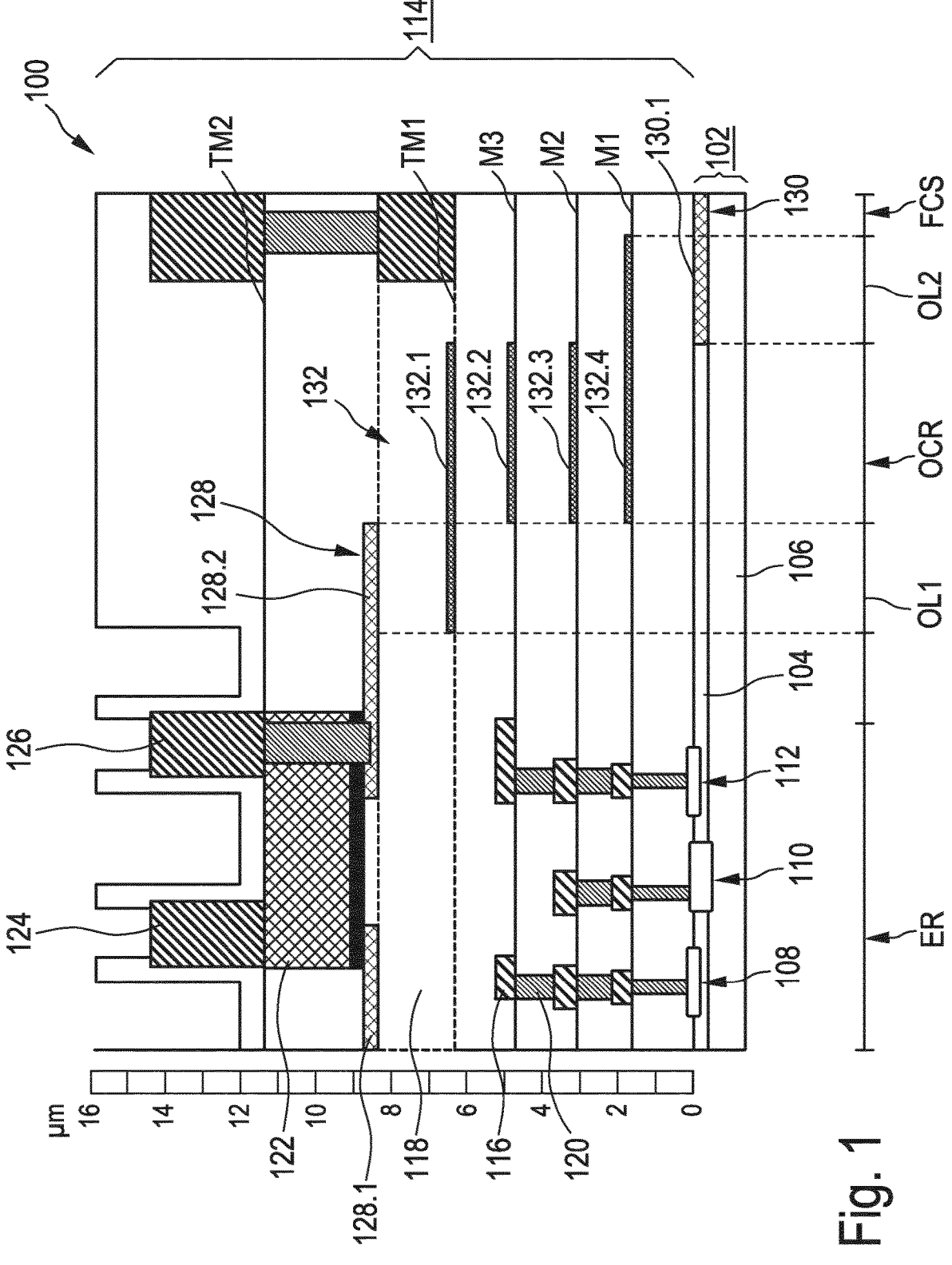
FIG. 1 is a schematic cross-sectional view of an optoelectronic device according to an embodiment of the present invention.

The integrated optoelectronic device 100 comprises a substrate 102, which in the present case is a silicon-on-insulator (SOI) substrate with a silicon layer 104 on a buried oxide (BOX) layer 106. The BOX layer 106 is arranged on a bulk bottom silicon layer (not shown) of the substrate 102.

The silicon layer 104 comprises electronic components. For the purpose of illustration, only three electronic components 108, 100, 112 are shown and represented only schematically by respective rectangles. The electronic components are components for processing electronic signals and may for instance be field-effect transistors (FET), bipolar transistors, diodes, or any other kind of electronic component, which can be arranged in the silicon layer of the SOI substrate 102 using a given processing technology, such as a MOS technology, in particular an NMOS, PMOS, CMOS or BiCMOS technology. In the integrated optoelectronic device 100, all electronic components are placed in one or more dedicated "electronic regions" ER of the silicon layer 104, which do not comprise optical components for guiding or processing optical signals, but only electronic components.

An interconnect stack 114 is arranged on the substrate 102. It comprises a plurality of metal levels. In the present exemplary embodiment, three metal levels M1 to M3 followed by two top metal levels TM1 and TM 2 are provided. For clarity of graphical representation, the metal levels are indicated by respective horizontal full lines. The metal levels are named by order numbers counting incrementally with increasing vertical distance from the substrate, starting with the first metal level M1 that is the one closest to the silicon layer of the substrate, up to the second top metal level TM2 at a highest vertical distance from the substrate 102. The metal and top metal levels contain structured metal connect traces, such as the metal connect trace 116, which in FIG. 1 are all indicated by bold diagonal hatching. The different metal levels are each embedded in and separated from each other by an interlevel dielectric material 118 such as $SiO_2$. Electrically conducting vias such as the via 120 provide for desired electrical connections between metal connect traces 116 on respective neighboring metal levels, or between the metal connect traces on the lowest metal level M1 and the electronic components, such as those shown under reference labels 108, 110, and 112, in the silicon layer 104. The vias a graphically represented by fine diagonal hatching.

In addition to such electronic components and their interconnect structures, the optoelectronic component 100 comprises one or more photonic components 122, an optical waveguide and optical interconnect structure, which will all be described in the following.

Notably, a photonic component 122 is arranged at a vertical distance from the substrate 102 that is larger than that of the highest of the metal levels M1 to M3, i.e., in the present case higher than the third metal level. In particular, in the present exemplary embodiment, the photonic component 122 is arranged in the interconnect stack 114 between the top metal levels TM1 and TM2. The photonic component 122 is indicated in FIG. 1 only schematically by a cross-hatched box. Exemplary components that may be integrated as the photonic component 122 in the optoelectronic device 100 will be shown with more structural detail in FIGS. 7 to 12. The photonic component 122 is electrically connected by contact traces 124 and 126 which are provided on the second top metal level TM2.

The photonic component 122 is also connected with an optical a first optical waveguide 128 that is arranged on the first top metal level TM1 in the interconnect stack 114 and optically coupled to the photonic component 122. The first optical waveguide 128 is herein referred to as the BEOL waveguide 128 for being fabricated in a back-end-of-line (BEOL) processing phase of the fabrication of the optoelectronic device 100. In the present exemplary embodiment, the BEOL waveguide 128 has a first BEOL waveguide section 128.1 that may for instance be used for providing optical input signals to the photonic component 122, and an optical BEOL coupling section 128.2 for providing optical output signals processed by the photonic component 122 to an optical interconnect structure 132. The particular structure of the BEOL waveguide 128 shown in FIG. 1 is of exemplary nature and may be varied according to the requirements of a particular application case. This will become clear from the description of further embodiments, in particular in connection with FIGS. 2 to 5.

The optoelectronic device 100 further has a second optical waveguide 130 that is arranged in the silicon layer 104 of the substrate 102. The second optical waveguide 130 is herein referred to as the FEOL waveguide 130 for being fabricated in a front-end-of-line (FEOL) processing phase of the fabrication of the optoelectronic device 100. The FEOL waveguide 130 has an optical FEOL coupling section 130.1. Also The particular structure of the FEOL waveguide 130 shown in FIG. 1 is of exemplary nature and may be varied according to the requirements of the given application case.

The mentioned optical interconnect structure 132 is extends laterally in an optical coupling region OCR between the BEOL coupling section 128.2 and the FEOL coupling section 130.1. For the purpose of definition, the lateral extension of the optical coupling region OCR includes lateral overlap sections of the interconnect stack that exhibit a lateral overlap of the BEOL coupling section 128.2 or of the FEOL coupling section 130.1 with the interconnect structure 132. In FIG. 1 the extension of such overlap sections is indicated by reference labels OL1 and OL2.

The optical interconnect structure 132 is arranged and configured for optically coupling radiation from the BEOL coupling section 128.2 into the FEOL coupling section 130.1 and vice versa. To this end, the optical interconnect structure 132 of the embodiment shown in FIG. 1 comprises a vertical stack of four optically coupled wave-guide elements 132.1 to 132.4 made of a first dielectric material, which each are embedded in a second dielectric material. The first dielectric material has an index of refraction of a higher value than the embedding second dielectric material in a desired wave-length range of operation of the optoelectronic device 100. In the present embodiment, the first dielectric material of the optically coupled waveguide elements is silicon nitride $Si_3N_4$, whereas the second dielectric material is $SiO_2$. Whereas $SiO_2$ is preferred as the embedding second dielectric material due to its predominant use as the interlevel dielectric material in BEOL technologies, the first dielectric material can be selected from a larger variety of materials. In particular, suitable materials for the first dielectric layer have an index of refraction higher than that $SiO_2$, suitably thus in the range between 1.5 and 2.8. Examples of suitable materials for use as the first dielectric material beside silicon nitride ($Si_xN_y$) are aluminum nitride (AlN), aluminum oxide ($Al_xO_y$), in particular sapphire ($Al_2O_3$), aluminumoxinitride (AlON) in any stoichiometry, hafnium oxide ($HfO_x$), tantalum oxide $Ta_2O_5$, titanium oxide ($TiO_x$), silicon oxinitride SiON, or zirconium oxide $ZrO_x$. Unspecified stoichiometries, partly indicated by indices x and y in the above list of materials, express variability in the material design for the purpose of optimization of optical properties and ease of fabrication in a given context of desired application and fabrication technology.

The optically coupled waveguide elements 132.1 to 132.4 are arranged and configured for receiving optical radiation in the desired wavelength range from the BEOL coupling section 128.2 by coupling of the optical radiation into at least one of the waveguide elements. Furthermore, the four coupled waveguide elements 132.1 to 132.4 are arranged and configured for cooperatively forming and sustaining, using the coupled optical radiation, one or more supermodes of optical radiation. Each supermode is a superposition of mode contributions from all four coupled waveguide elements 132.1 to 132.4 and is thus formed from a linear combination of the modes contributed by each of the individual waveguide elements 132.1 to 132.4. The supermodes thus vertically extend across the vertical stack of coupled optically coupled waveguide elements. A supermode can be achieved by suitable optical coupling between the waveguide elements 132.1 to 132.4. The coupling is achieved by fabricating the individual waveguide elements with suitable thickness and lateral extension, arranging the waveguide elements 132.1 to 132.4 with lateral overlap in a suitable vertical distance that depends in particular on the thickness of the waveguide elements. A suitable number of waveguide elements, suitable lateral and vertical extension parameters of the individual waveguide elements, a suitable material selection for the waveguide elements and the dielectric material and a suitable vertical and lateral arrangement of the waveguide elements can be determined in the design phase with the aid of a device simulation. An insight into certain design considerations will be given in the context of FIG. 6A to FIG. 6C. As a result of the particular arrangement, the waveguide elements 132.1 to 132.4 act cooperatively in the propagation of light. The arrangement of the coupled waveguide elements 132.1 to 132.4 further provides for coupling of the one or more supermodes into the FEOL coupling section 130.1.

Lateral extensions of the BEOL coupling section 128.2 of the BEOL waveguide 128 and the FEOL coupling section 130.1 of the FEOL waveguide 130 correspond to the respective lateral overlap with a next neighboring waveguide element of the interconnect structure 130. However, this is only an approximate description and not meant to say that other sections of the FEOL and BEOL waveguides do not contribute to the optical coupling. As will be shown by way of different examples in the context of the following Figures, the extension of the lateral overlap OL1 and OL2 may be selected from a range that includes a full lateral overlap.

The structural parameters of the interconnect structure 132 are to be selected by proper design in dependence on boundary conditions of the desired overall thickness of the device, the desired wavelength of operation and a suitable supermode to be formed in operation. The design is flexible in that it may be adapted to design constraints of a given BEOL process. For instance, the vertical distance between pairs of nearest wave-guide element of the optical interconnect structure 132 may vary within the interconnect stack due to fabrication requirements associated with the electronic interconnect structures in the interconnect stack 114. As an exemplary design measure that may be used to compensate for such varying distances between neighboring metal levels in the interconnect stack, the thicknesses of the individual waveguide elements may be adapted. Nonetheless, the following paragraphs describe typical suitable value ranges of structural parameters for different variants of the optoelectronic device 100, which also apply to similar device structures having photonic components arranged on top metal level.

The individual optical waveguide elements 132.1 to 132.4 are cuboids and have a respective a first lateral extension in a first lateral direction (z) between 50 and 150 micrometer, and a second lateral extension in a second lateral direction (x) that is perpendicular to the first lateral direction of between 2 micrometer and 10 micrometer. Suitable vertical extensions of the individual waveguide elements 132.1 to 132.4 are between 10 and 300 nanometer.

The FEOL coupling section 130.1 and the BEOL coupling section 128.1 are at a respective vertical distance of between 0.1 and 2 micrometer from their respective nearest waveguide element of the optical interconnect structure 132 and laterally overlap their respective nearest waveguide element. Suitably, the waveguide elements 132.1 to 132.4 are arranged at a vertical distance of between 0.5 and 2 micrometer from each other.

In operation of the optoelectronic device 100, optical radiation generated, modulated or otherwise processed by the photonic component 122 in a desired wavelength range is provided to the BEOL coupling section 128.1 and coupled into at least the waveguide element 132.1. Optical mode fields of the waveguide elements achieve mutual overlap coupling, which forms the basis for vertical transfer of optical signals over longer vertical distances. Using the coupled optical radiation, the waveguide elements 132.1 to 132.4 thus cooperatively form and sustain one or more supermodes of optical radiation that vertically extend across the vertical stack of coupled optically coupled waveguide elements formed by the interconnect structure 132, and couple the one or more supermodes into the FEOL coupling section 130.1.

While the above description concerned a propagation of optical signals in a direction from the BEOL waveguide 128 to the FEOL waveguide 130, it is clear that the optoelectronic device 100 may also be used for processing optical signals that propagate in the opposite direction without change in structure.

As indicated by a vertical thickness scale shown in FIG. 1 on the left of the optoelectronic device 100, the optical interconnect structure 132 achieves a highly efficient optical connection across a vertical distance, which in the present example amounts to almost 9 μm (micrometer) between the BEOL waveguide 128 and the FEOL waveguide 130. A vertical distance of 10 μm or even more would equally be possible with a suitably adapted optical interconnect structure. The overall device thickness of the optoelectronic device 100 with the integrated photonic component 122 amounts to roughly 16 μm.

For comparison, commercially available optoelectronic devices with photonic components made of material systems other than Si have a total thickness on the order of a of a few hundred nanometer to a few micrometer only. Such prior art devices have the photonic components and the BEOL waveguide immediately above the FEOL, and thus in a vertical region where metal plane spacings are below 1 μm.

In contrast, by using the optical interconnect structure 132, the integrated optoelectronic device 100 achieves the advantage of overcoming limitations of the prior art regarding the device thickness and arrangement of photonic components and BEOL waveguides. Optimized functionalities by use of active photonic components such as optical sources and modulators or passive photonic components such as multiplexers, couplers, or attenuators on higher metal levels can be achieved, in particular on the top metal levels featuring a larger vertical spacing between neighboring top metal levels. The arrangement of an integration region of active photonic components 122 in the interconnect stack 114 about 10 μm above the FEOL waveguide 130 in the substrate 102 allows integrating photonic components with a larger typical thickness of, e.g., 3 μm, such as lasers. Due to their fabrication in a BEOL processing phase, the photonic components from III-V or II-VI semiconductor compound materials or from other non-Si material systems can be integrated.

The optoelectronic device 100 also overcomes other disadvantages associated with the thickness limitation, in particular high series resistances, modal losses, or an increased epitaxial effort.

Figure 2C:
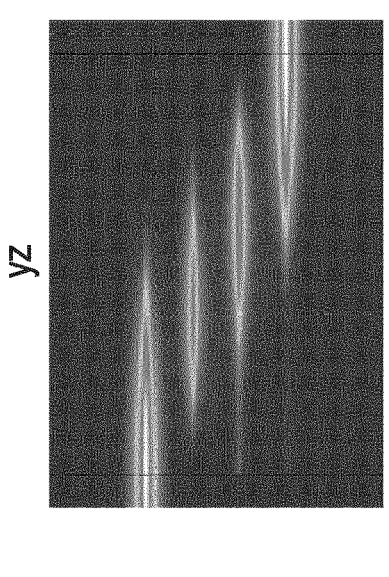
FIGS. 2A to 2C are different views of an embodiment of an optical interconnect structure for use in an optical coupling region of an optoelectronic device.
Figure 2B:
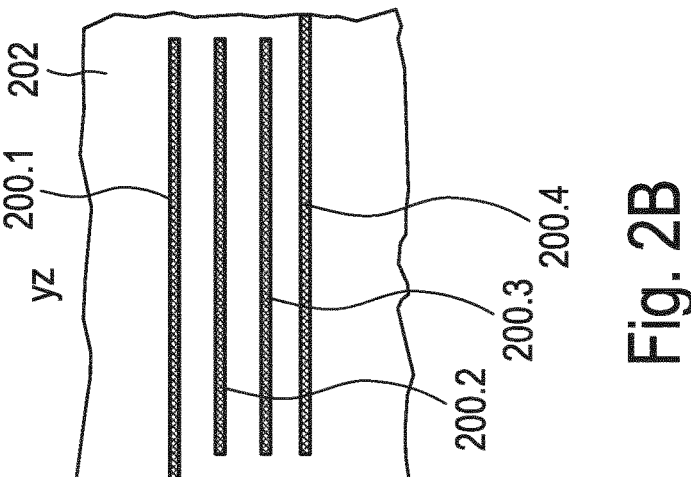
Figure 2A:
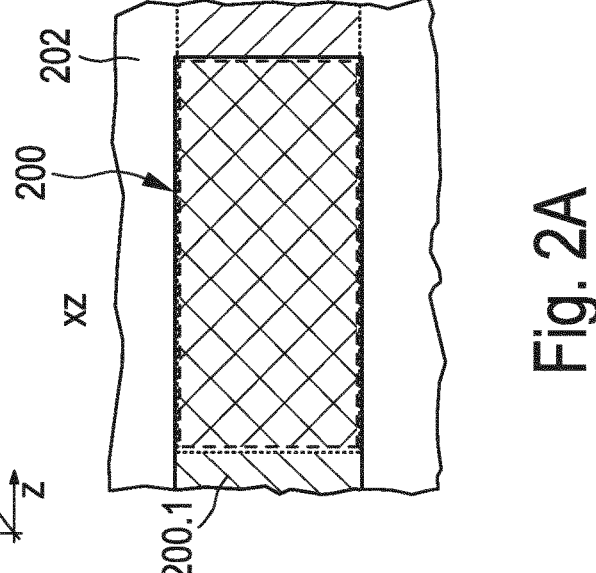

The following description turns to FIGS. 2A to 2C in parallel. FIGS. 2A to 2C are different views of an embodiment of an optical interconnect structure 200 for use in an optical coupling region of an optoelectronic device. In particular FIG. 2A is a schematic plan view of the optical interconnect structure 200, FIG. 2B is a schematic cross-sectional view of the optical interconnect structure 200 of FIG. 2A, and FIG. 2C is a simulation result showing an intensity distribution of light of a wavelength of 1550 nanometer in the area of the cross-sectional plane shown in FIG. 2B. In a black and white representation using grey scales, the lighter the grey tone, the higher is the intensity.

For reasons of graphical simplicity, only the interconnect structure 200 is shown, and no other structural elements of an optoelectronic device, in which the interconnect structure can be used. However, the interconnect structure 200 of FIG. 2 is similar to the interconnect structure 132 of FIG. 1, which thus provides sufficient context for integration of the interconnect structure 200 in any similar type of optoelectronic device.

The optical interconnect structure 200 has four dielectric waveguide elements 200.1 to 200.4 embedded in an inter-level dielectric material 202 having a lower index of refraction, which in the present case is SiO₂. The waveguide elements 200.1 to 200.4 have a thickness (y direction) of 50 nm. With reference to the plan view of FIG. 2A, a first lateral extension of the waveguide elements in the lateral direction x (i.e., the vertical direction in the paper plane of FIG. 2A) is 5 μm. A second lateral extension of the waveguide elements 200.2 and 200.3 in the direction z (i.e., the horizontal direction in the paper plane of FIG. 2A) is about 100 μm. The uppermost waveguide element 200.1 and the lowermost waveguide element 200.4 have a longer extension in the direction z to achieve optimized coupling to a BEOL waveguide (not shown) and an FEOL waveguide (not shown), respectively. A vertical distance between the respective neighboring waveguide elements is 1.5 μm. Thus, the waveguide elements 200.1 to 200.4 are in an equidistant vertical arrangement, and extend over a vertical distance of 4.5 μm, which allows arranging BEOL and FEOL waveguides at a vertical distance of approximately 7.5 μm. As can be seen from the simulation results in FIG. 2C, a supermode is cooperatively formed by a superposition of modes of the waveguide elements 200.1 to 200.4 and achieves transfer of optical radiation coupled into the uppermost waveguide element 200.1 from a BEOL waveguide (not shown) over the vertical distance of 4.5 μm and a lateral distance of 100 μm, such that radiation can then be coupled into an FEOL waveguide (not shown).

Thus, in comparison with the known coupling structure of two cascaded thick AlN waveguides (Zhu et al.), where a simple pairwise coupling from one directional AlN waveguide to the next is performed using thick AlN waveguides that cannot support a supermode formation, the optical interconnect structure 200 achieves a cooperative formation of a supermode from a superposition of modes of all four waveguide elements 200.1 to 200.4. This way, optical radiation can be coupled efficiently between a BEOL waveguide and an FEOL waveguide over a much larger vertical distance than with the structure known from Zhu et al. Whereas Zhu et al. bridge a vertical distance of 2 micrometers, the vertical distance in the present embodiment of FIG. 2A to C amounts to 7.5 micrometer and could even be increased further by proper design variation as outlined hereinabove.

Figures 3A, 3B, 3C:
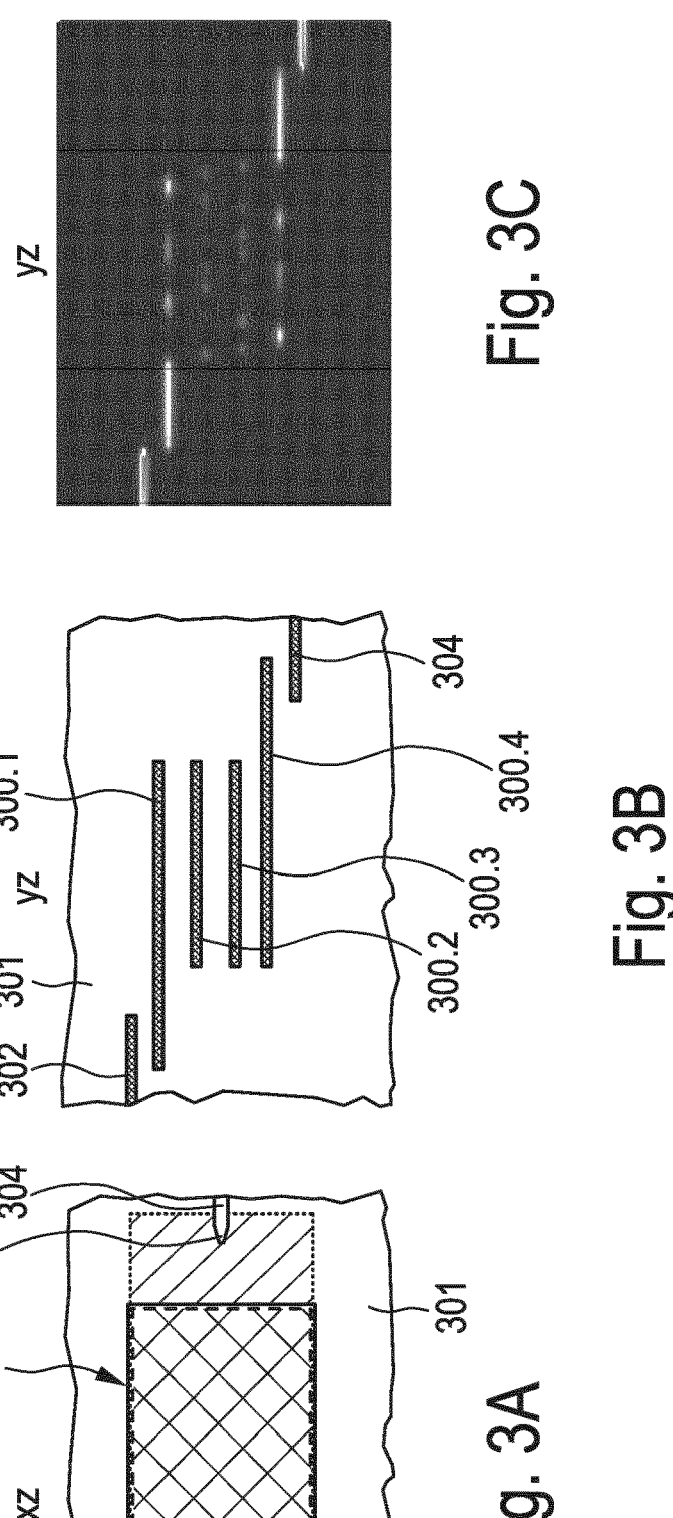
FIGS. 3A to 3C are different views of an embodiment of an optical interconnect structure for use in an optical coupling region of an optoelectronic device.

The following description turns to FIGS. 3A to 3C in parallel. FIGS. 3A to 3C are different views of an embodiment of an optical interconnect structure 300 for use in an optical coupling region of an optoelectronic device. FIG. 3A is a schematic plan view of the optical interconnect structure 300, FIG. 3B is a schematic cross-sectional view of the optical interconnect structure 300 of FIG. 3A, and FIG. 3C is a simulation result showing an intensity distribution of light of a wavelength of 1550 nanometer in the area of the cross-sectional plane shown in FIG. 3B. For reasons of graphical simplicity, only the interconnect structure 300 and coupling sections of a BEOL silicon waveguide 302 and of an FEOL silicon waveguide 304 are shown, and no other structural elements of an optoelectronic device, in which the interconnect structure can be used. However, the interconnect structure 300 of FIG. 3 is similar to the interconnect structure 132 of FIG. 1, which thus provides sufficient context for integration of the interconnect structure 300 in any similar type of optoelectronic device.

The optical interconnect structure 300 has four dielectric waveguide elements 300.1 to 300.4 embedded in an inter-level dielectric material 301 having a lower index of refraction, which in the present case is SiO₂. With reference to the plan view of FIG. 3A, a first lateral extension of the waveguide elements in the lateral direction x (i.e., the vertical direction in the paper plane of FIG. 3A) is 5 µm. A second lateral extension of the waveguide elements 300.2 and 300.3 in the direction z (i.e., the horizontal direction in the paper plane of FIG. 3A) is lower than 100 micrometer for the waveguide elements 300.2 and 300.3, in particular about 70 micrometer, whereas the waveguide elements 300.1 and 300.4 have an extension of about 100 micrometer in this direction. The uppermost waveguide element 300.1 and the lowermost waveguide element 300.4 of the optical interconnect structure 300 have a longer extension in the direction z to achieve optimized coupling to a BEOL silicon waveguide 302 and an FEOL silicon waveguide 304, respectively. The waveguide elements 300.1 to 300.4 have a thickness (y direction) of 50 nm. The BEOL silicon waveguide 302 and the FEOL silicon waveguide 304 each have a respective tapered coupling section 302.1 and 304.1, as visible in the plan view of FIG. 3A. The taper in the xz plane reduces a lateral extension of the waveguides from 450 nm to 180 nm. Both waveguides have a thickness of 220 nm.

A vertical distance between the respective neighboring waveguide elements 300.1 to 300.4 is 1.5 µm. Thus, the waveguide elements 300.1 to 300.4 are in an equidistant vertical arrangement. A vertical distance between the uppermost waveguide element 300.1 and the BEOL silicon waveguide 302 is 1.0 µm. In contrast, a vertical distance between the lowermost waveguide element 300.4 and the FEOL waveguide 304 is only 1.0 µm. Thus, the BEOL and FEOL silicon waveguides 302 and 304 are arranged at a vertical distance of approximately 6.5 µm from each other. As can be seen from the simulation results in FIG. 3C, a transfer of radiation coupled into the uppermost waveguide element 300.1 from the BEOL silicon waveguide 302 is achieved between the different waveguide elements 300.1 to 300.4, such that radiation can then be coupled into an FEOL silicon waveguide (not shown).

As can be inferred from a comparison between FIGS. 2 C and 3C, the different optical interconnect structures 200 and 300 give rise to a different supermode fields. The supermode formed by the interconnect structure 200 is of a simpler geometrical shape, whereas the supermode formed by the interconnect structure 300 is geometrically more complex and forms many different nodes and antinodes.

Figure 4B:
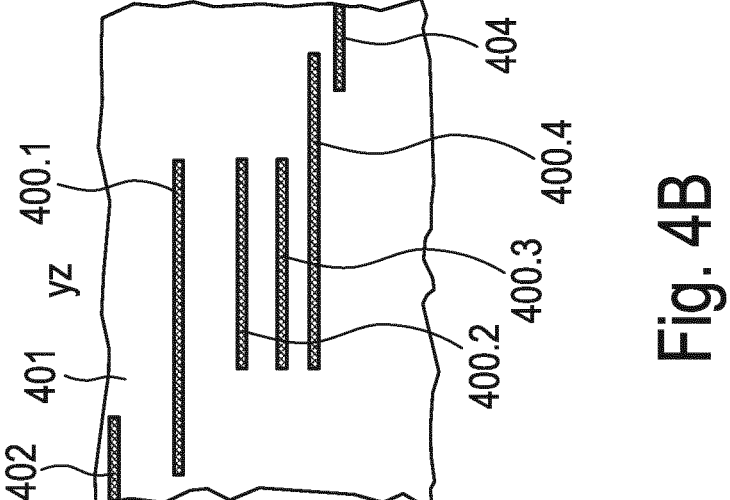
FIGS. 4A and 4B are different views of an embodiment of an optical interconnect structure for use in an optical coupling region of an optoelectronic device.
Figure 4A:
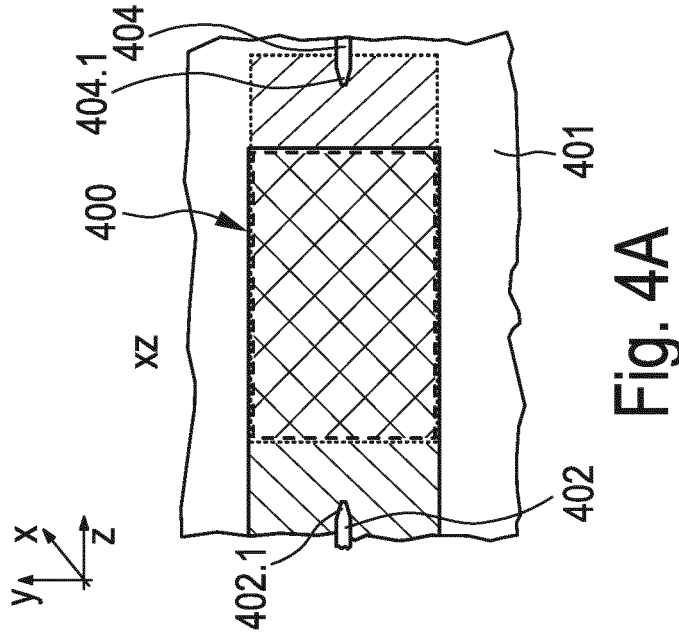

The following description turns to FIGS. 4A and 4B in parallel, which shows that an equidistant arrangement of the structural elements of the interconnect structure is not a requirement for achieving an efficient coupling. FIG. 4A is a schematic plan view of an optical interconnect structure 400, FIG. 4B is a schematic cross-sectional view of the optical interconnect structure 400 of FIG. 4A. Again, for reasons of graphical simplicity, only the interconnect structure 400 and coupling sections of a BEOL silicon waveguide 402 and of an FEOL silicon waveguide 404 are shown, and no other structural elements of an optoelectronic device, in which the interconnect structure 400 can be used. However, the interconnect structure 400 of FIG. 4 is similar to the interconnect structure 132 of FIG. 1, which thus provides sufficient context for integration of the interconnect structure 400 in any similar type of optoelectronic device.

The optical interconnect structure 400 has four dielectric waveguide elements 400.1 to 400.4 embedded in an interlevel dielectric material having a lower index of refraction, which in the present case is $SiO_2$. With reference to the plan view of FIG. 4A, a first lateral extension of the waveguide elements in the lateral direction x (i.e., the vertical direction in the paper plane of FIG. 3A) is 5 µm. A second lateral extension of the waveguide elements 400.2 and 400.3 in the direction z (i.e., the horizontal direction in the paper plane of FIG. 2A) is about 100 µm. The uppermost waveguide element 400.1 and the lowermost waveguide element 400.4 of the optical interconnect structure 400.4 have a longer extension in the direction z to achieve optimized coupling to a BEOL silicon waveguide 402 and an FEOL silicon waveguide 404, respectively. The waveguide elements 400.1 to 400.4 have a thickness (y direction) of 50 nm. The BEOL silicon waveguide 302 and the FEOL silicon waveguide 304 each have a respective tapered coupling section 302.1 and 304.1, as visible in the plan view of FIG. 3A. The taper in the xz plane reduces a lateral extension of the silicon waveguides 402 and 404 from 450 nm to 180 nm. Both waveguides have a thickness of 220 nm.

Vertical distances between the respective neighboring waveguide elements 400.1 to 400.4 vary in the present embodiment. The vertical distance is 1.5 µm between the waveguide elements 400.2 and 400.3, and between waveguide elements 400.3 and 400.4. However, the vertical distance is larger than 1.5 µm between the waveguide elements 400.1 and 400.2. Thus, the waveguide elements 400.1 to 400.4 are not in an equidistant vertical arrangement. A vertical distance between the uppermost waveguide element 400.1 and the BEOL silicon waveguide 402 is larger than 1.0 µm. In contrast, a vertical distance between the lowermost waveguide element 400.4 and the FEOL waveguide 404 is only 1.0 µm. In total, the BEOL and FEOL silicon waveguides 402 and 404 are arranged at a vertical distance of more than 6.5 µm from each other.

Figure 5C:
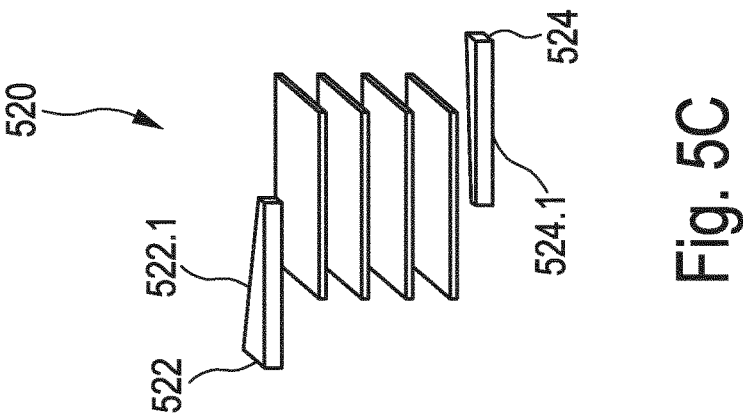
FIGS. 5A to 5C are schematic views of different embodiments of an optical interconnect structure for use in an optical coupling region of an optoelectronic device.
Figure 5B:
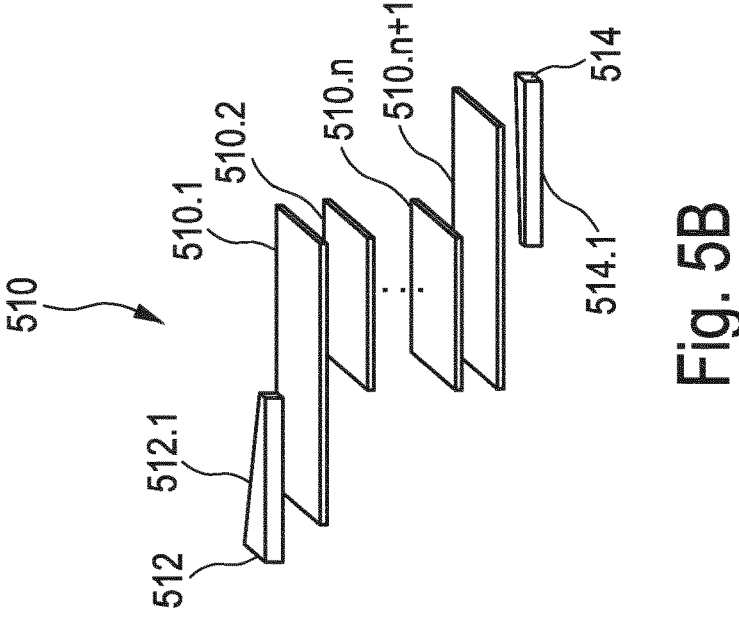
Figure 5A:
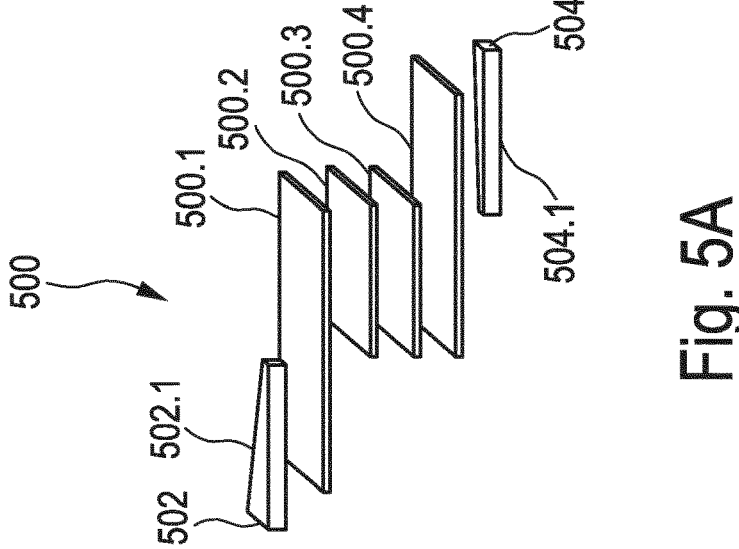

FIGS. 5A to 5C are schematic views of different embodiments of optical interconnect structures 500, 510, 520 for use in an optical coupling region of an optoelectronic device. The embodiments are generally similar to those shown previously. In particular, reference is made to the description of FIGS. 1 to 4 with regard to material selection, lateral and thickness extensions, and mutual vertical distances. All three optical interconnect structures 500, 510, and 520 are arranged between adiabatic tapered coupling sections 502.1, 512.1, 522.1 and 504.1, 514.1, 524.1 of a BEOL waveguide 502, 512, 522, and of an FEOL waveguide 504, 514, 524. The interconnect structure 500 has four waveguide elements 500.1 to 500.4 and corresponds in its geometry to the interconnect structure 200 of FIGS. 2A and 2B, and will thus not be further described. The interconnect structure 510 of FIG. 5B differs from that of FIG. 5A in that it has a higher number of waveguide elements 510.1, 510.2, ..., 510.n, and 510.n+1, which is useful for example to bridge a larger vertical distance between the BEOL and FEOL waveguides 512, 514. The number n+1 of waveguide elements that may be used to achieve optical interconnection with sufficient intensity depends on several factors, including the requirements of the application case including the incoming and outgoing light intensities, the distance to be bridged, the lateral geometry of the waveguide elements, the materials used, and the desired mode set for forming the supermode. The number of waveguide elements also provides an additional degree of freedom of optical design (index supermode, mode confinement in BEOL). Furthermore, the number of waveguide elements is correlated to the BEOL stack and its processing. More interconnect levels will require more waveguide elements. The number of waveguide elements will be chosen in accordance with the design of the BEOL interconnect stack. On the other hand, the number of waveguide elements can be chosen to suit any BEOL interconnect stack. This underlines the applicability to a wide spectrum of (Si) technologies.

The interconnect structure 520 of FIG. 5C differs from those of FIGS. 5A and 5B in that all waveguide elements 520.1 to 520.4 have the same lateral extension.

Further variants for achieving an efficient optical interconnection are possible. In particular, it is not a requirement to use tapered BEOL and FEOL waveguides. In one variant only one of the BEOL and FEOL waveguides is tapered. In another variant, the BEOL and FEOL waveguides are not tapered. In a further variant, the number of waveguide elements is higher than four, and all waveguide elements have the same lateral extension.

Figures 6A, 6B, 6C:
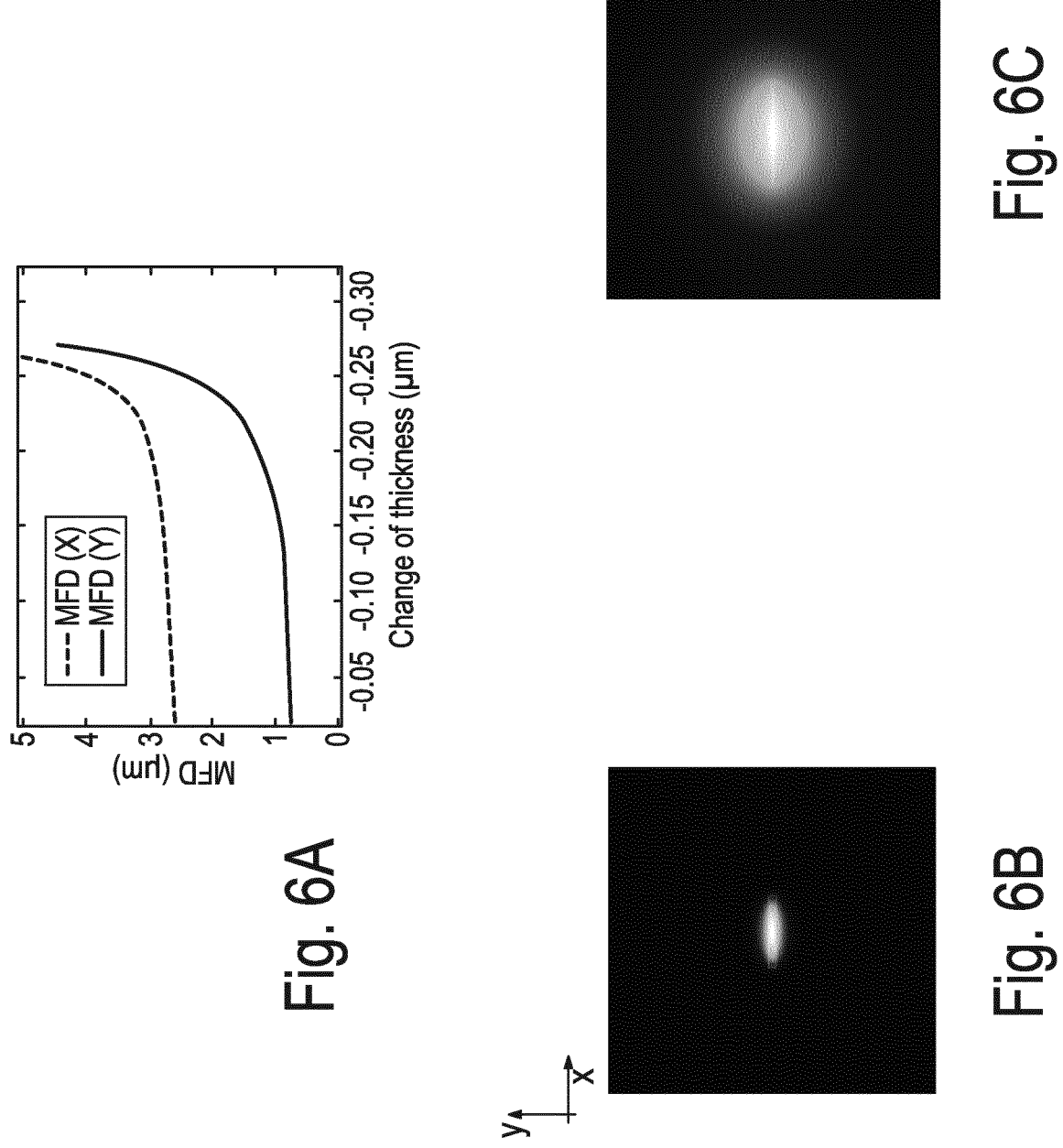
FIG. 6A is a plot showing a dependence of mode field diameter in two orthogonal directions x and y in dependence of a thickness reduction of a waveguide element.
FIGS. 6B and 6C are simulation results showing two-dimensional views on equal scale of a mode in waveguide elements of different thickness.

FIG. 6A is a plot showing a dependence of mode field diameter of a transverse electric (TE) mode field in two orthogonal directions x (dashed line) and y (full line) in dependence of a thickness reduction of a waveguide element, starting from a standard thickness of 300 nm. The thickness of the waveguide is reduced from the standard thickness with an increasing reduction amount along the abscissa of the plot of FIG. 6A. As can be seen, the mode field diameter in both x and y directions increases non-linearly with increasing reduction of the thickness of the waveguide element, thus providing a useful design parameter for the design of an optical interconnect structure. For visualization of this effect, FIGS. 6B and 6C are simulation results showing a two-dimensional view (x, y) on equal scale of an intensity distribution of a TE mode in two waveguide elements of two different thickness. The waveguide element used for the simulation result of FIG. 6B has a thickness of 300 nm, and the waveguide element used for the simulation result of FIG. 6C has a thickness of 50 nm. The lateral extension of the waveguide element used in the mode field calculation of FIG. 6A and in the images of FIGS. 6B and 6C is 3 μm in both x and y direction. The wavelength is 1550 nm in all cases.

FIGS. 7 to 12 are schematic top views of different embodiments of optoelectronic devices having different integrated photonic components for connection to the optical interconnect structure. With reference to FIG. 1, the photonic components shown in the embodiments of FIGS. 7 to 12 can thus be used to replace the photonic component. 122.

Figure 7:
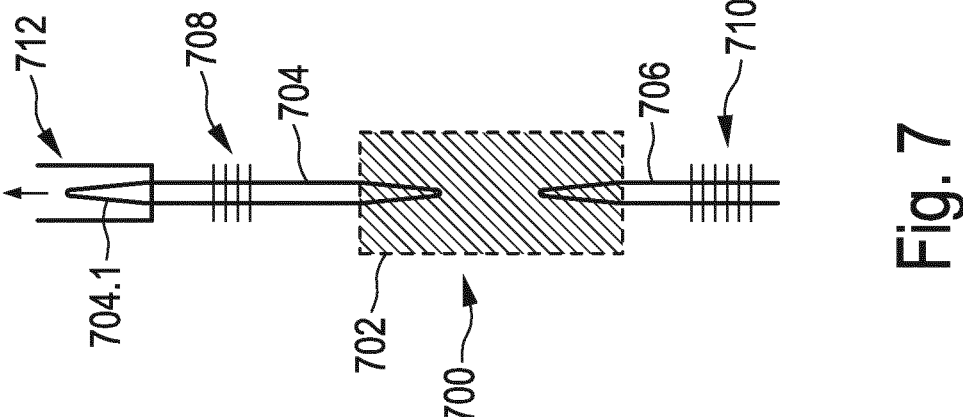

FIG. 7 shows an integrated active photonic component in the form of a semiconductor laser 700 with an active laser region 702 made of a III-V semiconductor material such as GaAs or another material from the InGaAlAs material family. As is per se known, the active laser region comprises a suitable structure for generating an amplifying light and typically includes a multi-quantum well structure or a similar quantum structure that achieves a charge carrier confinement in one or more dimensions. The active laser region 702 is optically coupled at its longitudinal ends to tapered Si waveguides 704, 706 which each have a grating 708, 710, which function as end mirrors providing feedback to the active laser region 702 to from a laser resonator. In the present example, the grating 710 has a higher reflectivity than the grating 708, and the grating 708 of lower reflectivity is used to couple a fraction of the light in the resonator into an optical interconnect structure 712 via a tapered coupling section 704.1 of the Si waveguide 704. The optical interconnect structure 712 is as described in the context of the embodiments of FIGS. 1 to 5, and not shown with structural detail in FIG. 7.

Figure 8:
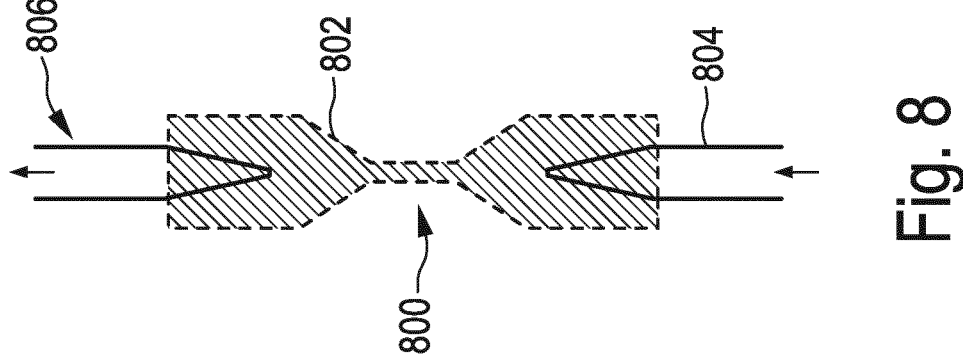

FIG. 8 shows an integrated active photonic component 800 comprising a non-linear passive waveguide component 802 of hour-glass shape between a tapered BEOL Si waveguide 804 and an optical interconnection structure 806. The non-linear passive waveguide component 802 of a suitable non-linear optical material may for instance be used to achieve a phase modulation of incoming light to achieve a desired non-linear effect such as phase matching or a frequency conversion. The optical interconnect structure 806 is as described in the context of the embodiments of FIGS. 1 to 5, and not shown with structural detail in FIG. 8.

Figure 9:
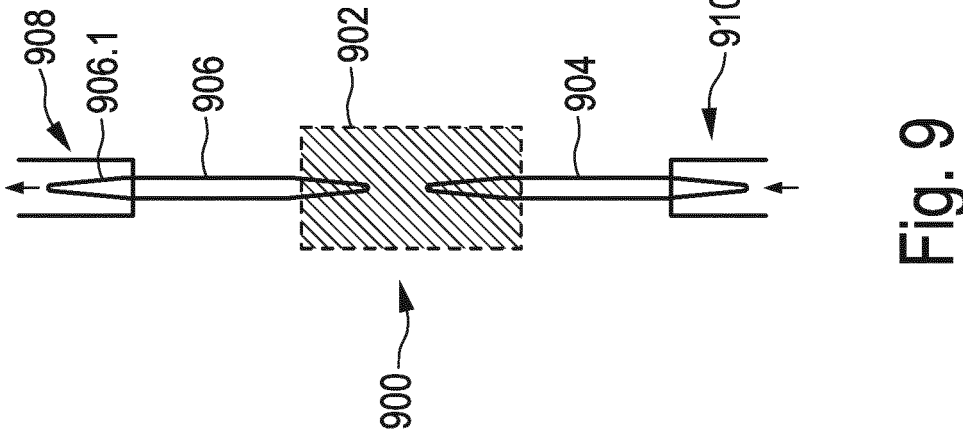

FIG. 9 shows an integrated active photonic component in the form of a modulator 900 comprising an active modulator region 902 made of a III-V semiconductor material. The active modulator region 902 is optically coupled at its longitudinal ends to tapered BEOL Si waveguides 904, 906. The Si waveguide 906 is used to couple light into a first optical interconnect structure 908 via a tapered coupling section 906.1 of the Si waveguide 906. The first optical interconnect structure 908 is as described in the context of the embodiments of FIGS. 1 to 5, and not shown with structural detail in FIG. 9. Furthermore, light to be fed to the active modulator region 902 is provided via a FEOL waveguide (not shown) on the substrate level and via a second optical interconnect structure 910 into the BEOL Si waveguide 904. The second optical interconnect structure 910 is as described in the context of the embodiments of FIGS. 1 to 5, and not shown with structural detail in FIG. 9.

FIG. 10 shows an integrated active photonic component in the form of a modulator 1000 comprising an active modulator region 1002 made of lithium niobate (LNB), barium titanate (BTO) or lead zirconate titanate (PZT), which can be subjected a transverse electric field by applying a voltage to electrodes 1004 and 1006 to achieve a modulation using the Pockels effect. A BEOL waveguide 1008 extends between the electrodes 1004 and 1006 and is connected to an optical interconnect structure (not shown) as described in the context of the embodiments of FIGS. 1 to 5.

FIG. 11 shows an integrated active photonic component in the form of a photodiode 1100 coupled to a BEOL SiN waveguide 1102. Incoming light is provided to the BEOL SiN waveguide 1102 from a FEOL waveguide (not shown) via an optical interconnect structure (not shown) as described in the context of the embodiments of FIGS. 1 to 5.

FIG. 12 shows an integrated active photonic component in the form of a photodetector 1200 coupled to a BEOL Si waveguide 1202. Incoming light is provided to the BEOL Si waveguide 1202 via an optical interconnect structure 1204 as described in the context of the embodiments of FIGS. 1 to 5.

In summary, the present invention provides integrated optoelectronic device comprising a substrate with a silicon layer that comprises one or more electronic components. An interconnect stack is arranged on the substrate and comprising a plurality of metal levels. An optical waveguide, herein FEOL waveguide, on the substrate has an optical FEOL coupling section. A photonic component is arranged in the interconnect stack at a vertical distance from the substrate. An optical waveguide in the interconnect stack, herein BEOL waveguide, is optically coupled to the photonic component and has an optical BEOL coupling section. An optical interconnect structure is arranged and configured for optically coupling radiation from the BEOL coupling section into the FEOL coupling section and vice versa. The optical interconnect structure comprises a vertical stack of optically coupled waveguide elements made of a first dielectric material, which each are embedded in a second dielectric material and which in a desired wavelength range have an index of refraction of a higher value than the embedding second dielectric material. The optically coupled waveguide elements are arranged and configured for receiving optical radiation in the desired wavelength range from the BEOL coupling section or the FEOL coupling section by coupling the optical radiation into at least one of the waveguide elements, and cooperatively forming and sustaining, using the coupled optical radiation, one or more supermodes of optical radiation, each of the one or more supermodes being a superposition of modes of all of the at least two optically coupled waveguide elements, and for coupling the one or more supermodes into the FEOL coupling section or the BEOL coupling section, respectively.

What is claimed is:

1. An integrated optoelectronic device comprising
a substrate with a silicon layer that comprises one or more electronic components;
an optical waveguide, hereinafter FEOL waveguide on the substrate, the FEOL waveguide having an optical FEOL coupling section;
an interconnect stack arranged on the substrate and comprising a plurality of metal levels, which contain structured metal connect traces and are separated from each other by an interlevel dielectric material, the metal levels being named by order numbers counting incrementally with increasing vertical distance from the substrate and starting with a first metal level that is the one closest to the silicon layer of the substrate, up to a top metal level at a highest vertical distance from the substrate;
a photonic component arranged in the interconnect stack at a vertical distance from the substrate larger than that of the second metal level;
an optical waveguide in the interconnect stack, hereinafter BEOL waveguide, optically coupled to the photonic component and having an optical BEOL coupling section; and
an optical coupling region that extends between the BEOL coupling section and the FEOL coupling section and comprises an optical interconnect structure arranged and configured for optically coupling radiation from the BEOL coupling section into the FEOL coupling section and vice versa; wherein
the optical interconnect structure comprises a vertical stack of at least two optically coupled waveguide elements made of a first dielectric material, which each are embedded in a second dielectric material and which in a desired wavelength range have an index of refraction of a higher value than the embedding second dielectric material; and wherein
the optically coupled waveguide elements are arranged and configured for
receiving optical radiation in the desired wavelength range from the BEOL coupling section or the FEOL coupling section by coupling the optical radiation into at least one of the waveguide elements,
cooperatively forming and sustaining, using the coupled optical radiation, one or more supermodes of optical radiation, each of the one or more supermodes being a superposition of modes of all of the at least two optically coupled waveguide elements, and for
coupling optical radiation of the one or more supermodes into the FEOL coupling section or the BEOL coupling section, respectively.

2. The integrated optoelectronic device of claim 1, wherein
the individual optical waveguide elements laterally overlap each other and have a respective vertical extension of between 10 and 300 nanometer and are arranged at a vertical distance of between 0.5 and 2 micrometer from each other,
the FEOL coupling section and the BEOL coupling section are at a respective vertical distance of between 0.1 and 2 micrometer from their respective nearest waveguide element of the optical interconnect structure and laterally overlap their respective nearest waveguide element.

3. The integrated optoelectronic device of claim 1, wherein
the individual optical waveguide elements have a respective first lateral extension in a first lateral direction (z) between 10 and 1000 micrometer, and a second lateral extension in a second lateral direction (x) that is perpendicular to the first lateral direction of between 1 micrometer and 20 micrometer.

4. The integrated optoelectronic device of claim 1, wherein
the first dielectric material is aluminum nitride, an aluminum oxide, an aluminum oxinitride, a hafnium oxide, a tantalum oxide, a titanium oxide, a silicon nitride, a silicon oxinitride, or a zirconium oxide, and wherein
the second dielectric material is silicon dioxide.

5. The integrated optoelectronic device of claim 1, wherein
the interconnect stack comprises at least two metal levels and at least one additional top metal level;
a top interlevel dielectric layer between the two top metal levels has a larger vertical extension than the interlevel dielectric layers between the metal levels;
the material of the interlevel dielectric layers, of the top interlevel dielectric layer and of the second dielectric material in the optical coupling region is identical; and wherein
the BEOL optical waveguide is embedded in the top interlevel dielectric layer.

6. The integrated optoelectronic device of claim 1, wherein the BEOL coupling section of the BEOL optical waveguide and the FEOL coupling section of the FEOL optical waveguide have a taper.

7. The integrated optoelectronic device of of claim 1, wherein an active region of the photonic component comprises or is completely made of III-V semiconductor material.

8. The integrated optoelectronic device of claim 1, wherein the photonic component is an electrically drivable component and electrically connectable via the top metal level, wherein an optical output of the photonic component is optically coupled to the BEOL optical waveguide via a second BEOL coupling section.

9. The integrated optoelectronic device of claim 7, wherein the photonic component is a laser, an optical amplifier, a light detector, an optical modulator for modulating intensity, phase or polarization of light, an optical switch, an optical delay element, or an optical frequency converter.

10. The integrated optoelectronic device of claim 7, wherein the electrically drivable photonic component is a semiconductor laser, which comprises a laser resonator that includes an electrically drivable gain region made of the III-V-semiconductor material for providing optical gain.

11. The integrated optoelectronic device of claim 10, wherein the semiconductor laser is a distributed-feedback laser diode.

12. The integrated optoelectronic device of claim 7, wherein the plurality of metal levels in the interconnect stack includes at least three metal levels, a first top metal level and a second top metal level above the at least three metal levels, the second top metal level being the top metal level at the highest vertical distance from the substrate; wherein a mutual vertical distance between the first and second top metal levels is larger than a mutual vertical distance between the metal levels below the first top metal level; and wherein the photonic component and the BEOL waveguide are arranged at a vertical level between the first and second top metal levels.

13. The integrated optoelectronic device of claim 1, wherein the substrate is a silicon-on-insulator substrate, herein SOI substrate, and the silicon layer comprising the one or more electronic components is arranged above a buried oxide layer; and wherein the FEOL waveguide having the optical FEOL coupling section is formed in the silicon layer of the SOI substrate.

14. A method for fabricating an optoelectronic device, the method comprising:

performing front-end-of line, hereinafter FEOL, processing to provide a silicon-on-insulator, hereinafter SOI, substrate with a silicon layer arranged above a buried oxide layer and comprising one or more electronic components and with a FEOL optical waveguide formed in the silicon layer, wherein a FEOL coupling section is fabricated in the FEOL optical waveguide;

performing back-end-of-line, hereinafter BEOL, processing to fabricate an interconnect stack on the substrate, the BEOL processing comprising fabricating a plurality of metal levels of the interconnect stack, which contain structured metal connect traces and are separated from each other by an interlevel dielectric material, the metal levels being named by order numbers counting incrementally with increasing vertical distance from the substrate and starting with a first metal level that is the one closest to the silicon layer of the substrate, up to a top metal level at a highest vertical distance from the substrate; and fabricating a photonic component arranged in the interconnect stack at a vertical distance from the substrate larger than that of the second metal level; and fabricating an optical coupling region that extends between a BEOL coupling section and the FEOL coupling section and comprises an optical interconnect structure arranged and configured for optically coupling radiation from the BEOL coupling section into the FEOL coupling section and vice versa;

wherein fabricating the optical interconnect structure comprises fabricating a vertical stack of optically coupled waveguide elements made of a first dielectric material, which each are embedded in a second dielectric material and which in a desired wavelength range have an index of refraction of a higher value than the embedding second dielectric material; and arranging and configuring the optically coupled waveguide elements for receiving optical radiation in the desired wavelength range from the BEOL coupling section or the FEOL coupling section by coupling the optical radiation into at least one of the waveguide elements, cooperatively forming and sustaining, using the coupled optical radiation, one or more supermodes of optical radiation, each of the one or more supermodes being a superposition of modes of all of the at least two optically coupled waveguide elements, and for coupling optical radiation of the one or more supermodes into the FEOL coupling section or the BEOL coupling section, respectively.

* * * * *